(12) United States Patent
Wehlus

(10) Patent No.: US 10,177,340 B2
(45) Date of Patent: Jan. 8, 2019

(54) OPTOELECTRONIC DEVICE AND METHOD OF PRODUCING AN OPTOELECTRONIC DEVICE

(71) Applicant: OSRAM OLED GmbH, Regensburg (DE)

(72) Inventor: Thomas Wehlus, Lappersdorf (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 15/505,653

(22) PCT Filed: Aug. 31, 2015

(86) PCT No.: PCT/EP2015/069839
§ 371 (c)(1),
(2) Date: Feb. 22, 2017

(87) PCT Pub. No.: WO2016/034533
PCT Pub. Date: Mar. 10, 2016

(65) Prior Publication Data
US 2017/0256735 A1    Sep. 7, 2017

(30) Foreign Application Priority Data
Sep. 4, 2014   (DE) .................. 10 2014 112 739

(51) Int. Cl.
*H01L 51/56* (2006.01)
*H01L 51/52* (2006.01)
*H01L 51/50* (2006.01)

(52) U.S. Cl.
CPC ........ *H01L 51/525* (2013.01); *H01L 51/5012* (2013.01); *H01L 51/5206* (2013.01); *H01L 51/5212* (2013.01); *H01L 51/5221* (2013.01); *H01L 51/5253* (2013.01); *H01L 51/56* (2013.01); *H01L 2251/5361* (2013.01); *H01L 2251/5392* (2013.01)

(58) Field of Classification Search
None
See application file for complete search history.

(56) References Cited

U.S. PATENT DOCUMENTS

2012/0199869 A1    8/2012  Tsurume

FOREIGN PATENT DOCUMENTS

| DE | 10 2006 047 433 A1 | 11/2007 |
|---|---|---|
| DE | 10 2009 044 262 A1 | 5/2010 |
| DE | 10 2012 203 637 A1 | 9/2013 |
| DE | 10 2012 109 218 A1 | 4/2014 |
| EP | 1 238 306 B1 | 9/2002 |
| WO | 2005/106573 A1 | 11/2005 |
| WO | 2009/001241 A1 | 12/2008 |

*Primary Examiner* — Michael Lebentritt
(74) *Attorney, Agent, or Firm* — DLA Piper LLP (US)

(57) ABSTRACT

An optoelectronic device includes a covering layer, a first electrode, a functional layer stack arranged between the covering layer and the first electrode and a plurality of spacers, wherein the functional layer stack has an organic active layer that generates electromagnetic radiation; the first electrode has conductor tracks with branching points, the spacers are each arranged on one of the branching points, and the functional layer stack is arranged in places between the covering layer and the spacers.

19 Claims, 3 Drawing Sheets

OPTOELECTRONIC DEVICE AND METHOD OF PRODUCING AN OPTOELECTRONIC DEVICE

TECHNICAL FIELD

This disclosure relates to an optoelectronic device and a method of producing an optoelectronic device.

BACKGROUND

An organic light-emitting diode (OLED) normally has an organic functional layer stack and a covering layer arranged on the layer stack. In large-area diodes in particular, the covering layer can be bent due to its own weight or external mechanical influences towards the layer stack due to which the covering layer presses on the layer stack and causes extensive damage.

To avoid such damage, the distance between the covering layer and the layer stack can be enlarged. However, this disadvantageously leads to an increase in the overall thickness of the diode. The stability of the diode is also impaired by the increased distance and an enlarged cavity thus created between the covering layer and the layer stack. Alternatively, in EP 1 238 306, devices with randomly distributed spacers between the covering layer and the layer stack are described. However, in the event of an external force acting on the covering layer, these spacers press directly onto the layer stack and damage not only a portion of the layer stack covered by the spacers, but also its surroundings, which possibly leads to extensive damage to the layer stack and thus to an inhomogeneity with respect of luminance distribution as well as an increased short circuit risk.

It could therefore be helpful to provide a particularly thin and mechanically stable optoelectronic device with a more uniform distribution of the luminance as well as a simplified and reliable method of producing an optoelectronic device.

SUMMARY

I provide an optoelectronic device including a covering layer, a first electrode, a functional layer stack arranged between the covering layer and the first electrode and a plurality of spacers, wherein the functional layer stack has an organic active layer that generates electromagnetic radiation, the first electrode has conductor tracks with branching points, the spacers are each arranged on one of the branching points, and the functional layer stack is arranged in places between the covering layer and the spacers.

I also provide a method of producing an optoelectronic device including a covering layer, a first electrode with conductor tracks and branching points, a functional layer stack and a plurality of spacers, the method including a) providing a carrier body, b) forming the first electrode on the carrier body, c) forming the spacers on the branching points, d) applying the layer stack both to the first electrode and the spacers, and e) applying the covering layer, wherein the functional layer stack is arranged in places between the covering layer and the spacers.

I further provide an optoelectronic device including a covering layer, a first electrode, a functional layer stack arranged between the covering layer and the first electrode and a plurality of spacers, wherein the functional layer stack has an organic active layer that generates electromagnetic radiation, the first electrode has conductor tracks with branching points, the spacers are each arranged on one of the branching points, the functional layer stack is arranged in places between the covering layer and the spacers, and the spacers are each spaced from one another in the lateral direction, and the spacers each cover exactly one of the branching points.

DETAILED DESCRIPTION

Figure 1:
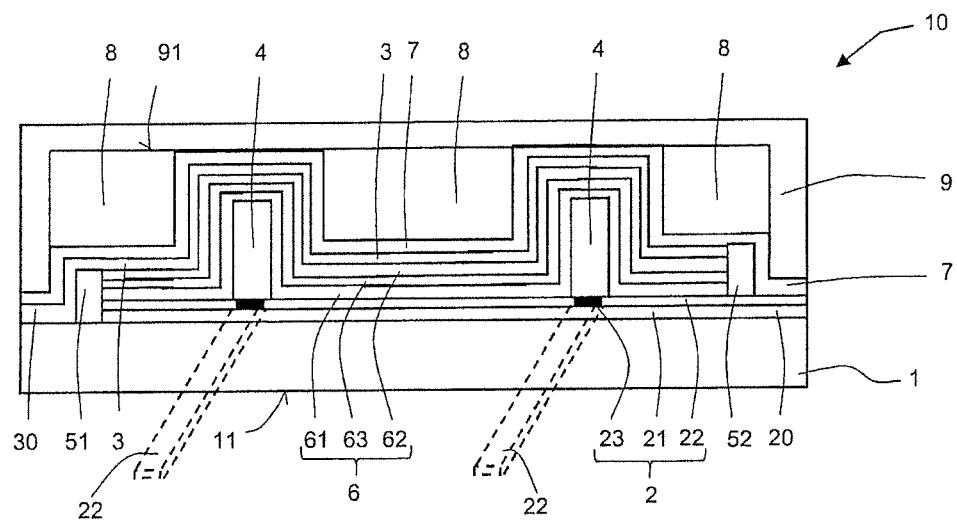
FIG. 1 shows a schematic representation of an example of an optoelectronic device.

The device may have a functional layer stack. The functional layer stack contains in particular a plurality of organic layers. For example, the organic layers are arranged above one another. The functional layer stack has an organic active layer that generates electromagnetic radiation, for example. In particular, the organic active layer emits electromagnetic radiation, in particular in the ultraviolet, visible or infrared spectrum, in operation of the device.

The functional layer stack has, for example, an organic layer executed as a hole transport layer and an organic layer formed as an electron transport layer. In particular, the organic active layer is arranged between the hole transport layer and the electron transport layer.

The device may have a carrier body. The functional layer stack is arranged on the carrier body. The carrier body contains glass, for example, or consists of glass. The carrier body has, in particular on a side remote from the layer stack, a radiation exit surface of the device. The carrier body is formed transparently for the electromagnetic radiation generated in operation of the device. "Formed transparently for the radiation generated" means that in particular at least 70%, preferably at least 80%, especially preferably at least 90% of the electromagnetic radiation generated is let through.

The device may have a first electrode. The first electrode is arranged directly on the carrier body, for example. The first electrode is arranged in a vertical direction in particular between the carrier body and the functional layer stack. A vertical direction is understood to be directed perpendicular to a main extension plane of the carrier body or the first electrode. The first electrode is used to energize the functional layer stack in operation of the device.

The first electrode is formed transparently for the electromagnetic radiation generated in operation of the device, for example. In particular, the first electrode has a first electrode layer containing a transparent, conductive oxide (TCO), for example, or consists of this.

The device may have a first electrode with a plurality of conductor tracks known also as bus-bars. For example, the conductor tracks comprise a metal, for instance copper or silver. The conductor tracks are arranged directly on a side of the first electrode layer remote from the carrier body, for example. In particular, the first electrode has a network of intersecting conductor tracks with branching points, wherein the conductor tracks intersect or meet at the branching points. Branching point is understood to be a point at which at least two or three or four conductor tracks with different lateral orientations intersect or meet. Lateral direction or orientation is understood to be a direction directed in particular parallel to the main extension plane of the carrier body or the first electrode. The vertical direction and the lateral direction are thus perpendicular to one another. The electrical cross-conductivity of the first electrode is effectively increased by the conductor tracks. A particularly uniform current distribution on the first electrode layer can be achieved by a suitable distribution of the conductor tracks.

The device may have a plurality of spacers. The spacers are each arranged, for example, on one of the branching points and cover this at least partly or completely. The spacers are arranged in a vertical direction between the first electrode and the functional layer stack, for example. The spacers are each spaced from one another in the lateral direction. In particular, the spacers each cover exactly one branching point. However, it is also possible that a spacer covers more than one branching point along a conductor track.

The device may have a covering layer. The functional layer stack is arranged in particular between the covering layer and the first electrode. In particular, the functional layer stack is arranged in places between the covering layer and the spacers. The covering layer contains glass, for example, or consists of this. Alternatively, the covering layer can be formed from a radiation-opaque material.

The optoelectronic device may have a covering layer, a first electrode, a functional layer stack arranged between the covering layer and the first electrode and a plurality of spacers. The functional layer stack has an organic active layer that generates electromagnetic radiation. The functional layer stack is arranged in places between the covering layers and the spacers. The first electrode has conductor tracks with branching points, wherein the spacers are arranged, respectively, on one of the branching points. The device is an OLED, for example.

If external pressure is exerted on the covering layer, it can rest on the spacers, due to which the mechanical stability of the device is significantly increased. For example, the spacers are formed to be electrically insulating. The layer stack is not energized or not directly energized by the first electrode in particular at its areas overlapping with the spacers. Even if the areas of the layer stack are damaged by external force acting on the covering layer, this has scarcely any or no influence on a uniform distribution of the luminance and the efficiency of the device. Even a short circuit risk between the first electrode and another electrode arranged on the spacer can largely be excluded.

The device may have a cavity between the covering layer and the functional layer stack. For example, the spacers are vertical elevations in the cavity. The spacers adjoin the first electrode in particular. Due to the cavity, the pressing of the covering layer onto at least a majority of the functional layer stack is avoided, due to which damage to the functional layer stack and to the other layers of the device applied to the layer stack is prevented. Compared to conventional devices, for example, frit-encapsulated devices or devices with cavity glass covering layers, an overall height of the device with spacers is also reduced while stability remains the same and possible damage to the layer stack caused by the pressing on of the covering layer is avoided.

The spacers may cover, in a plan view of the carrier body, overall at most 5%, for example, at most 3% or at most 1% of a total area of the radiation exit surface. Such a distribution of the spacers on the branching points in which the spacers in a plan view of the carrier body only cover a small proportion of the radiation exit surface that is substantially already covered by the conductor tracks has no or scarcely any negative influence on the efficiency of the device regarding the outcoupling of the radiation and thus guarantees a uniform distribution of the luminance on the radiation exit surface.

The covering layer may have a cavity. In particular, the covering layer has a surface facing the layer stack that forms a base surface of the cavity. In particular, the base surface of the cavity of the covering layer is also a base surface of the cavity formed in the device.

The device may have a second electrode. In particular, the functional layer stack and the spacers are arranged between the first electrode and the second electrode. For example, the second electrode is reflectively formed for the radiation generated in operation of the device. The second electrode energizes the functional layer stack in operation of the device.

The organic active layer may be formed contiguously. In a plan view of the first electrode, the organic active layer completely covers the spacers and the branching points, for example. In particular, both the first electrode and the second electrode are each formed contiguously.

The covering layer may be free of direct physical contact with the spacers. For example, a surface of the covering layer facing the layer stack is free of direct physical contact with the spacers or with a connecting layer, for instance an adhesive layer, between the covering layer and the spacers. This means that the spacers are not attached in particular to the covering layer. It is also possible that the entire surface of the covering layer facing the layer stack only adjoins an air layer in the normal state of the device, and the covering layer is only directly or indirectly supported on the spacers in the event of deformation caused due to an external force acting on the covering layer.

The functional layer stack may cover the spacers completely in a plan view of the first electrode. In particular, the spacers are completely surrounded in lateral directions by the functional layer stack. For example, the functional layer stack reproduces a contour of the spacers in places. A reproduction of the contour of the spacers enlarges a surface of a light-emitting layer, namely of the organic active layer of the layer stack.

For example, the spacer has the contour of a cuboid, a cylinder or a truncated cone. It is also possible that the spacers each have the form of adjacent geometrical bodies, for instance cuboids, cylinders, cones or truncated cones. To increase stability, the spacer can have a lower cross section facing the first electrode and an upper cross section facing the covering layer, wherein the lower cross section is larger than the upper cross section. Alternatively, the lower cross section can be formed smaller than the upper cross section, due to which a proportion of the radiation exit surface covered by the spacers is reduced.

The spacers may each have a first section and a second section. In particular, the second section has a smaller cross section compared to the first section. For example, the second section with the smaller cross section is arranged between the first section and the covering layer. A configuration of this kind guarantees the stability of the spacers and minimizes the proportion of the layer stack between the spacers and the covering layer that might possibly be damaged by the covering layer pressing onto the spacers.

The first electrode may have an electrode layer of a transparent conductive material, for example, indium tin oxide (ITO). In particular, the conductor tracks are arranged directly on the first electrode layer. The conductor tracks can form a rectangular, in particular a square lattice in this case, or a hexagonal lattice with branching points. A rectangular or a hexagonal lattice of conductor tracks guarantees a homogeneous distribution of the current density on the first electrode. Such a configuration of the conductor tracks with regularly distributed branching points and the spacers arranged thereon guarantees in addition a particularly high mechanical stability of the device.

My method of producing an optoelectronic device may have a covering layer, a first electrode with conductor tracks and branching points, a functional layer stack and a plurality of spacers, wherein a carrier body is first provided having in particular glass or consists of glass. The first electrode is formed on the carrier body. The spacers are formed on the branching points of the first electrode. In particular, the spacers each cover one of the branching points. The layer stack is then applied both to the first electrode and the spacers. This means that the layer stack is applied to the first electrode in particular after formation of the spacers. Finally, the covering layer is applied to the carrier body so that the functional layer stack is arranged in places between the covering layer and the spacers.

The functional layer stack may be applied to the spacers such that the functional layer stack reproduces a contour of the spacers in places. In particular, the layer stack can be applied in layers to the first electrode and to the spacers by a coating method, for example, by vapor deposition.

In the method, an electrically insulating material, for example, a coating layer, may be applied by a printing process, for example, a screen printing process, an inkjet printing process or a pad-printing process, in places to the first electrode to form the spacers. In particular, the electrically insulating material is applied only to the branching points at which the conductor tracks intersect or meet.

Such a targeted production of spacers on the branching points of the first electrode can be realized at no great effort or expense. Due to the use of the spacers, the stability of the device is significantly increased. If the covering layer has a cavity, the depth of the cavity and thus an overall height of the device can be reduced without the layer stack or other layers applied to the layer stack, for instance the second electrode and the protective layer, being damaged by the pressing on of the covering layer.

The method is particularly suitable for production of a device described above. Features described in connection with the device can therefore also be used for the method and vice versa.

Other advantages, preferred developments of the optoelectronic device as well as of the method result from the examples explained below in connection with the Figures.

Identical elements, similar elements or elements producing the same effect are provided with the same reference signs in the figures. The figures are schematic representations and, therefore, not necessarily to scale, rather comparatively small elements and in particular layer thicknesses can be shown exaggeratedly large for clarification purposes.

A first example of an optoelectronic device is shown schematically in FIG. 1.

The optoelectronic device 10 has a carrier body 1, a first electrode 2 arranged on the carrier body 1, a functional layer stack 6 arranged on the first electrode 2 and a covering layer 9. In a vertical direction the functional layer stack 6 is arranged between the covering layer 9 and the first electrode 2. In particular, the layer stack 6 is encapsulated in an airtight manner or as airtight as possible by the covering layer 9 and the carrier body.

The carrier body 1 is radiation-transmissive, for example, in particular formed transparently for radiation generated in operation of the device 10 and has a radiation exit surface 11 of the device 10 on a side remote from the layer stack 6. This means that the radiation generated in operation of the device 10 exits the device 10 at the radiation exit surface 11. The carrier body 1 and/or the covering layer 9 can contain glass or respectively consist of glass. The covering layer 9 can also comprise a metal.

The functional layer stack 6 has an organic active layer 63. The active layer 63 emits electromagnetic radiation in operation of the device, for example, in the ultraviolet, visible or infrared spectrum. The layer stack 6 also contains a first charge transport layer 61 and a second charge transport layer 62, wherein the organic active layer 63 is arranged in a vertical direction between the first charge transport layer 61 and the second charge transport layer 62. In particular, the organic active layer 63 directly adjoins the first and second charge transport layer. The first and second charge transport layer can be formed as electron transport layer and as hole transport layer for injecting holes and electrons into the organic active layer 63.

Besides the first electrode 2, the device has a second electrode 3 for electrical contacting of the layer stack 6. The layer stack 6 is arranged between the first electrode 2 and the second electrode 3, wherein the first and the second electrode each adjoin one of the charge transport layers of the layer stack 6. The first electrode 2 has a first connection point 20, which is arranged in a lateral direction at the side of the layer stack 6. In particular, the conductor tracks 22 cover the connection point 20. The second electrode 3 has a second connection point 30, wherein the second connection point 30 is likewise arranged at the side of the layer stack 6 and is spaced at a distance laterally from the first connection point 20. In FIG. 1 both the first connection point 20 and the second connection point 30 are arranged directly on the carrier body 1 of the device 10. The device 10 can connect to an external power source via the first and second connection points.

The first electrode 2 has a first electrode layer 21. The first electrode layer 21 can contain transparent conductive materials, which are, for example, transparent conductive oxides, for example, metal oxides such as zinc oxide, tin oxide, cadmium oxide, indium oxide or indium tin oxide (ITO).

The first electrode 2 has a plurality of conductor tracks 22. The conductor tracks 22 are arranged on a side of the first electrode layer 21 facing the layer stack 6. In particular, the first electrode 2 has a network of intersecting conductor tracks 22 and branching points 23, wherein the conductor tracks 22 intersect or meet at the branching points 23.

The optoelectronic device 10 has a plurality of spacers 4. The spacers 4 are each arranged on one of the branching points 23. In a plan view of the first electrode 2, the spacers 4 each cover the corresponding branching point at least partly or completely. Outside the coverage areas of the branching points 23, the device is in particular free of the spacers 4. Such a distribution of the spacers 4 has no or scarcely any negative influence on the efficiency regarding radiation outcoupling of the optoelectronic device 10, as in a plan view of the carrier body 1, the spacers 4 substantially cover only points of the radiation exit surface 11 already covered by the conductor tracks 22.

The spacers 4 are vertical elevations on the first electrode 2. In particular, the spacers 4 are formed to be electrically insulating. To form the spacers 4, a layer of an electrically insulating material, for example, a coating layer, is applied in places to the first electrode 2, in particular targetedly to the branching points 23, for example, by a printing process. The spacers 4 are arranged in a vertical direction between the first electrode 2 and the layer stack 6 with the electrode 3 arranged on it. The first electrode 2 and the second electrode 3 are each formed contiguously, for example, and in particular are free of structured points, for instance free of holes or recesses in the respective electrodes.

The second electrode 3 can be applied in particular by a coating process, for instance by physical or chemical vapor deposition, for example, directly onto the layer stack 6. The second electrode 3 is formed in particular reflectively for the radiation emitted in operation of the device 10.

For example, the second electrode 3 reflects at least 70%, for example, at least 80% or 90% of the radiation impinging onto the second electrode in the direction of the radiation exit surface 11. The second electrode 3 contains a metal in particular, for instance aluminum or silver.

In particular, following formation of the spacers 4, the layer stack 6 can be applied in layers to the first electrode 2 and the spacers 4 by a coating process, for example, by physical or chemical vapor deposition. The layer stack 6 can be formed in a lateral direction between a first insulating structure 51 and a second insulating structure 52. In a plan view of the first electrode 2, the functional layer stack 6 completely covers the spacers 4. The spacers 4 are completely enclosed by the functional layer stack 6 in lateral directions.

In FIG. 1, the organic active layer 63 is formed contiguously and in a plan view of the first electrode completely covers the spacers 4 as well as the branching points 23. The functional layer stack 6 reproduces a contour of the spacers 4 in places. The functional layer stack 6 with the organic active layer 63 thus likewise has vertical elevations at locations of the spacers 4. A surface of the radiation-emitting organic active layer 63 is enlarged by such vertical elevations due to which comparatively more radiation is generated in operation of the device.

The functional layer stack 6 is arranged in places between the covering layer 9 and the spacers 4. The layer stack 6 and the second electrode 3 have areas that overlap with the spacers 4 in a plan view of the first electrode 2. A vertical distance between the first electrode 2 and the second electrode 3 is increased at the overlapped areas. Even if the overlapped areas of the layer stack 6 and the second electrode 3 arranged thereon are damaged by an external force acting on the covering layer 9, a short circuit risk can be largely excluded on account of the increased distance between the electrodes and in particular on account of the electrical insulation due to the spacers 4.

The device 10 also has a protective layer 7. The protective layer 7 can be formed as an encapsulation layer that prevents penetration of air or moisture into the functional layer stack 6. The protective layer 7 can also be formed such that it protects the functional layer stack 6 from external mechanical influences. In FIG. 1, the protective layer 7 is arranged between the covering layer 9 and the functional layer stack 6. The protective layer 7 here directly adjoins the second electrode 3.

The device 10 has a cavity 8 formed between the covering layer 9 and the functional layer stack. In particular, the cavity 8 is free of a material in a solid state of aggregation. The cavity 8 is filled with air, for example.

The covering layer 9 is formed as a cavity covering layer. This means that the covering layer 9 itself has a cavity or is formed in the form of a cavity. In FIG. 1, the covering layer 9 is arranged such that the cavity of the covering layer 9 comprises the cavity 8 formed in the device 10. The covering layer has a surface 91 facing the layer stack 6, which surface forms both a base surface of the cavity of the covering layer 9 and a base surface of the cavity 8 of the device 10.

In FIG. 1, the covering layer 9 is free of direct physical contact with the spacers 4. In other words, the covering layer 9 does not adjoin the spacers 4. Arranged in a vertical direction between the spacers 4 and the covering layer 9 are other layers that are different from a retaining layer in particular, namely the functional layer stack 6, the second electrode 3 and the protective layer 7.

In FIG. 1, the surface 91 of the covering layer 9 facing the layer stack 6 adjoins a layer, the protective layer 7, which is applied to the spacers 4. The covering layer 9 thus rests in places on the spacers 4. A configuration of this kind increases mechanical stability of the optoelectronic device 10 relative to external forces. Even possible damage to the layer stack 6 outside the areas of the spacers 4 can thus largely be avoided.

Figure 2A:
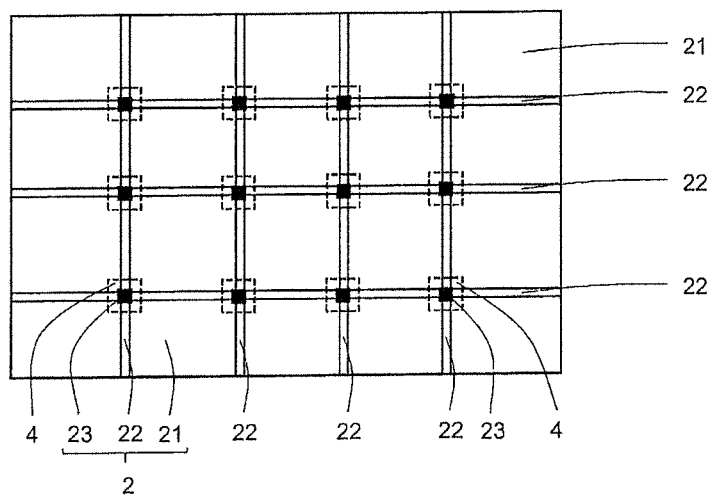
FIGS. 2A and 2B show schematic representations of an electrode of an optoelectronic device with spacers arranged thereon.

FIG. 2A shows a schematic representation of an example of a first electrode with spacers arranged thereon.

The first electrode 2 has a first electrode layer 21 with conductor tracks 22 arranged thereon. The conductor tracks 22 intersect at the branching points 23 and form a rectangular lattice on the first electrode layer 21. The conductor tracks 22 can be applied in a structured manner to the first electrode layer 21 by a printing or coating process. Alternatively, the conductor tracks can first be applied extensively and then structured.

The spacers 4 are laterally spaced at a distance from one another and each cover exactly one branching point 23. Here, a spacer 4 completely covers the associated branching point 23. However, it is also possible that the spacer 4 only partly covers the associated branching point 23. In FIG. 2A, all branching points 23 are each covered by a spacer 4. It is possible, however, that only a portion of the branching points 23 is covered by the spacers 4.

In particular, in a plan view of the carrier body 1, the spacers 4 cover in total at most 5%, for example, at most 3% or at most 1% of a total area of the radiation exit surface 11.

Figure 2B:
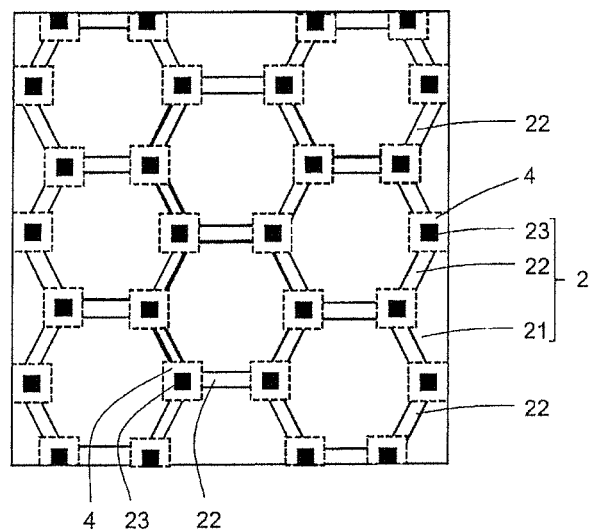

FIG. 2B shows a schematic representation of another first electrode with spacers arranged thereon for an optoelectronic device.

This example corresponds substantially to the example in FIG. 2A. In contrast, the first electrode 2 has a hexagonal lattice of conductor tracks 22 with branching points 23. By such a configuration of the conductor tracks 22 and such an arrangement of the spacers 4, a particularly stable device with a particularly uniform current distribution on the first electrode 2 can be achieved.

Figure 3A:
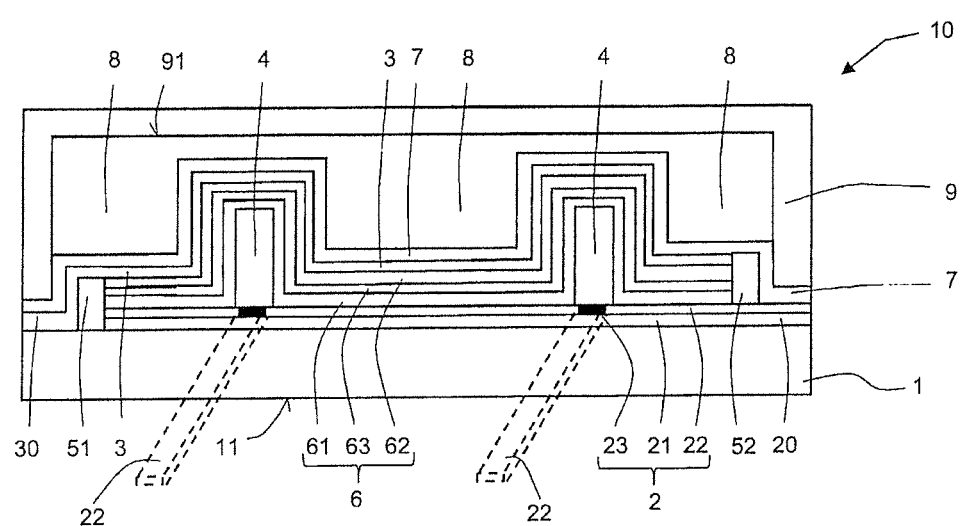
FIGS. 3A and 3B show other examples of an optoelectronic device in a schematic sectional view.

Another example of an optoelectronic device 10 is represented schematically in FIG. 3A in a sectional view.

This example corresponds substantially to the example shown in FIG. 1. In contrast, the surface 91 of the covering layer 9 facing the layer stack 6 is free of any physical contact with the layers applied to the spacers 4 and the first electrode 2. In particular, the device 10 has an air gap between these layers and the surface 91 of the covering layer. This means that the entire surface 91 of the covering layer adjoins an air layer.

In FIG. 3A, the surface 91 of the covering layer 9 facing the layer stack 6 is a base surface of the cavity 8. The covering layer 9 is thus not supported on the spacers 4 in the normal state, but only in the event of a sufficiently large force acting on the covering layer 9. While the weight of the covering layer 9 is already partly supported by the spacers 4 in the normal state in FIG. 1, it is not so according to the example in FIG. 3A. A configuration of this kind reduces pressure exerted on the protective layer 7, the second electrode 2 and the functional layer stack 6 in the event of an external force acting on the covering layer.

Figure 3B:
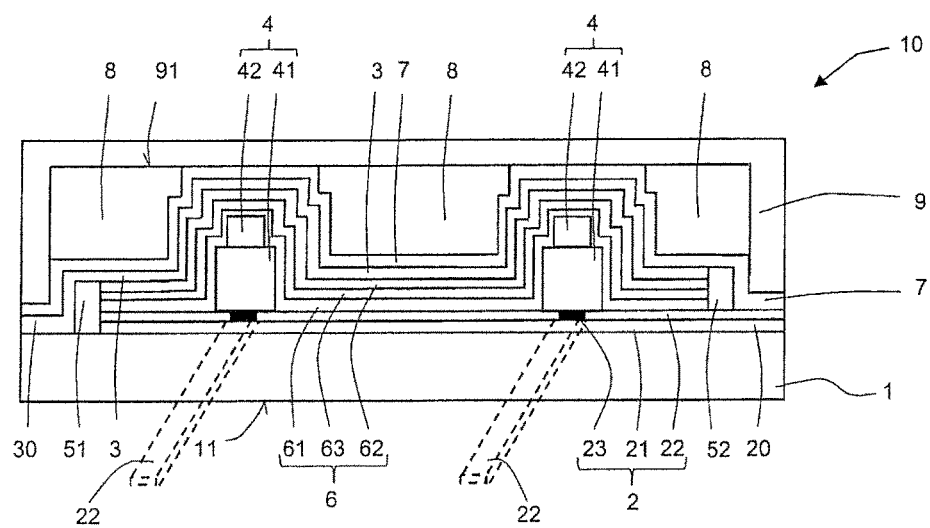

Another example of an optoelectronic device 10 is shown schematically in a sectional view in FIG. 3B.

This example corresponds substantially to the example shown in FIG. 1. In contrast, the spacer 4 has a first section 41 and a second section 42. The second section 42 has a smaller cross section compared to the first section 41 and is arranged between the first section 41 and the covering layer 9. The first section 41 and the second section 42 can be formed from an identical material, for instance in the form of a coating layer, or have different materials. In FIG. 3B, the spacer 4 is formed in two-piece. Moreover, it is possible for the spacer 4 to be formed in one-piece or to comprise several sections. The spacer 4 can also have the form of a cuboid, a cylinder, a cone, a truncated cone or other geometrical shapes. In FIG. 3B, the functional layer stack 6, the second electrode 3 and the protective layer 7 reproduce a contour of the spacers 4 in places.

This application claims priority of DE 10 2014 112 739.0, the subject matter of which is hereby incorporated by reference.

My devices and methods are not restricted by the description with reference to the examples. On the contrary, this disclosure comprises every new feature and every combination of features, which includes in particular every combination of features in the appended claims, even if the feature or combination is not itself explicitly specified in the claims or examples.

The invention claimed is:

1. An optoelectronic device comprising:
  a covering layer, a first electrode, a functional layer stack arranged between the covering layer and the first electrode and a plurality of spacers, wherein
  the functional layer stack has an organic active layer that generates electromagnetic radiation,
  the first electrode has conductor tracks with branching points,
  the spacers are each arranged on one of the branching points,
  the functional layer stack is arranged in places between the covering layer and the spacers, and
  at least one of i to x:
    i. a cavity is located between the covering layer and the functional layer stack, and the spacers are vertical elevations in the cavity,
    ii. the covering layer is free of direct physical contact with the spacers,
    iii. the functional layer stack completely covers the spacers in a plan view of the first electrode,
    iv. the functional layer stack reproduces a contour of the spacers in places,
    v. the spacers are completely surrounded by the functional layer stack in lateral directions,
    vi. the organic active layer is formed contiguously and, in a plan view of the first electrode, completely covers the spacers and the branching points,
    vii. the functional layer stack and the spacers are arranged between the first electrode and a second electrode, and the second electrode is formed to be radiation-reflective,
    viii. the spacers each have a first section and a second section, and the second section has a smaller cross section compared to the first section and is arranged between the first section and the covering layer,
    ix. the first electrode has an electrode layer of a transparent conductive material, and the conductor tracks are arranged directly on the electrode layer, and
    x. the conductor tracks form a rectangular or a hexagonal grid.

2. A method of producing an optoelectronic device comprising a covering layer, a first electrode with conductor tracks and branching points, a functional layer stack and a plurality of spacers, the method comprising:
  a) providing a carrier body;
  b) forming the first electrode on the carrier body;
  c) forming the spacers on the branching points;
  d) applying the layer stack both to the first electrode and the spacers; and
  e) applying the covering layer, wherein the functional layer stack is arranged in places between the covering layer and the spacers.

3. The method according to claim 2, wherein the functional layer stack is applied to the spacers such that the functional layer stack reproduces a contour of the spacers in places.

4. The method according to claim 2, wherein, to form the spacers, a coating layer is applied in places to the first electrode by a printing process.

5. The method according to claim 2, wherein the layer stack is applied in layers to the first electrode and to the spacers by a coating process.

6. An optoelectronic device comprising:
  a covering layer, a first electrode, a functional layer stack arranged between the covering layer and the first electrode and a plurality of spacers, wherein
  the functional layer stack has an organic active layer that generates electromagnetic radiation,
  the first electrode has conductor tracks with branching points,
  the spacers are each arranged on one of the branching points,
  the functional layer stack is arranged in places between the covering layer and the spacers, and
  the spacers are each spaced from one another in the lateral direction, and the spacers each cover exactly one of the branching points.

7. The device according to claim 6,
  wherein, in a plan view of the first electrode, the spacers each at least partly or completely cover corresponding branching point, and
  outside the coverage areas of the branching points, the device is free of the spacers.

8. The device according to claim 6,
  wherein the spacers each comprise at least two sections, and
  each of the spacers has a first section and a second section, said second section having a smaller cross section compared to the first section and being arranged between the first section and the covering layer.

9. The device according to claim 1,
  wherein the spacers each comprise at least two sections, and
  each of the spacers has a first section and a second section, said second section having a smaller cross section compared to the first section and being arranged between the first section and the covering layer.

10. The device according to claim 1, further comprising i.
11. The device according to claim 1, further comprising ii.
12. The device according to claim 1, further comprising iii.
13. The device according to claim 1, further comprising iv.
14. The device according to claim 1, further comprising v.

15. The device according to claim 1, further comprising vi.

16. The device according to claim 1, further comprising vii.

17. The device according to claim 1, further comprising viii.

18. The device according to claim 1, further comprising ix.

19. The device according to claim 1, further comprising x.

* * * * *